United States Patent [19]
Schlott et al.

[11] Patent Number: 5,728,279
[45] Date of Patent: Mar. 17, 1998

[54] COBALT BASE ALLOY TARGET FOR A MAGNETRON CATHODE SPUTTERING SYSTEM

[75] Inventors: Martin Schlott; Martin Weigert, both of Hanau, Germany; Kwei Teng, Saratoga; Bruce Gehman, Morgan Hill, both of Calif.

[73] Assignee: Leybold Materials GmbH, Hanau, Germany

[21] Appl. No.: 356,109

[22] Filed: Dec. 15, 1994

[30] Foreign Application Priority Data

Dec. 20, 1993 [DE] Germany ............................ 43 43 440.1
Mar. 24, 1994 [DE] Germany ............................ 44 10 114.7

[51] Int. Cl.$^6$ ..................... C23C 14/34; C22C 19/07
[52] U.S. Cl. ................ 204/298.13; 420/435; 420/436; 420/441; 420/442; 420/580; 420/588; 420/444; 420/447; 420/448; 148/408; 148/425; 148/313
[58] Field of Search ................... 204/298.12, 298.13; 148/313, 408, 425; 420/435, 436, 441, 442, 444, 447, 448, 580, 588

[56] References Cited

U.S. PATENT DOCUMENTS

| | | | |
|---|---|---|---|
| 3,356,542 | 12/1967 | Smith | 148/408 |
| 4,620,872 | 11/1986 | Hijikata et al. | 75/246 |
| 4,832,810 | 5/1989 | Nakamura et al. | 204/298.13 |
| 4,992,095 | 2/1991 | Nate et al. | 204/298.13 |
| 5,112,468 | 5/1992 | Weigert et al. | 204/298.13 |

FOREIGN PATENT DOCUMENTS 0535314  4/1993  European Pat. Off.

OTHER PUBLICATIONS

Binory Alloy PhaseDiagrams, Second Edition, ASM International, vol. 2, p. 1245 (1990).

Cobalt Monograph, Centré D. Information du Cobalt, Brussels, 1960, pp. 198, 199, 214–231.

Hansen, Max: Constitution of Binary Alloys, McGraw Hill, 1958, pp. 508–510.

*Primary Examiner*—Robert Kunemund
*Assistant Examiner*—Rodney G. McDonald
*Attorney, Agent, or Firm*—Felfe & Lynch

[57] ABSTRACT

Target for a magnetron-cathode sputtering apparatus is made from a cobalt base alloy containing additional elements in such concentrations that intermetallic phases are formed with at least one of these elements and intermetallic phases are observed on the basis of the phase diagram in the state of equilibrium at the operating temperature of the target. The grain boundaries, sub-grain boundaries, twin-grain boundaries or slip bands of the cobalt mixed crystal forming the matrix are decorated with the elements forming the intermetallic phases. X-ray diffraction diagrams made from the target display reflections of an intermetallic phase which is largely absent in the cast state and which forms only during a heat treatment in the temperature range below the solidus temperature of the alloy by a solid state reaction.

6 Claims, 1 Drawing Sheet

COBALT BASE ALLOY TARGET FOR A MAGNETRON CATHODE SPUTTERING SYSTEM

BACKGROUND OF THE INVENTION

The invention pertains to a cobalt base alloy target for magnetron cathode sputtering systems, the target containing additional elements in concentrations large enough that intermetallic phases are formed with at least one of these elements and that, on the basis of the phase diagram in the equilibrium state, intermetallic phases are observed at the operating temperature of the target.

To optimize the sputtering process during magnetron cathode sputtering, permanent magnets are set up behind the target (cathode) in such a way that a magnetic field is formed in the discharge space in front of the target to localize the discharge plasma. The area of the target surface above which the plasma is localized is therefore sputtered away more quickly than other areas are, as a result of which an erosion trough is formed.

In the case of ferromagnetic targets, there are two main problems which occur in this regard:

First, the magnetic flux of the permanent magnets is bundled in the target, with the result that only a small amount of flux can penetrate into the discharge space. This problem therefore means that very thin ferromagnetic targets must be used.

Second, the effect of the local reduction in the cross section of the target during sputtering (erosion trough) in the case of a ferromagnetic target is to direct an increasing amount of magnetic flux directly over the erosion trough. As a result, there is a local increase in the ionization probability of the sputtering gas, and the sputtering rate increases locally also. As a result, the erosion trough becomes very narrow, and this means that the yield of material from the target is considerably decreased.

It is possible to improve the magnetic field geometries and to achieve higher magnetic field penetration by using targets of complicated design. By providing the target with slots perpendicular to the direction of the magnetic field, the magnetic resistance in the target can be increased and a larger field can be obtained in the discharge space (K. Nakamura et al., IEEE Transactions on Magnetics, Vol. MAG-18, 1982, pp. 1,080-1,082). Kukla et al. (IEEE Transactions on Magnetics, Vol. MAG-23, 1987, pp. 137-139) describe a cathode for ferromagnetic materials which consists of several individual targets, which are arranged in two planes, one on top of the other, to achieve a more powerful magnetron magnetic field. These designs are more expensive, however, and they also make it more difficult to carryout the process of magnetron cathode sputtering.

U.S. Pat. No. 5,112,468 describes a target for use in magnetron cathode sputtering systems, in which magnetic field penetration can be achieved by providing the target with a hexagonal (0001)-fiber texture perpendicular to the surface. As a result, better utilization of the target, the initial thickness of which can be greater, is said to be achieved. According to U.S. Pat. No. 5,112,468, this (0001)-fiber texture is obtained by cold working at temperatures below 400° C. It has been found, however, that this cold working is difficult or impossible to perform if, as a result of the composition of the alloy, the target contains significant amounts of intermetallic phases.

U.S. Pat. No. 4,832,810 describes a sputtering target of a cobalt base alloy, which has only a single cubic phase at temperatures just below the melting point. By means of suitable rolling procedures at temperatures below the martensitic transformation point, a target is obtained with an x-ray diffraction diagram which shows a much larger number of hexagonal phase components than the material obtained immediately after casting. It was found again that the described cold working procedures are difficult or impossible to perform if the cobalt base alloys contain significant amounts of intermetallic phases. In all cases, large cracks in the rolled plates occurred even at small thickness reductions.

SUMMARY OF THE INVENTION

It is therefore the task of the present invention to develop a target of cobalt-base alloys for magnetron cathode sputtering systems, which targets contain additional elements in concentrations large enough that intermetallic phases are formed with at least one of the elements and that, on the basis of the phase diagram and the solidification kinetics in the equilibrium state, intermetallic phases can be detected at the operating temperature of the target. The goal here is to obtain a target with high magnetic field penetration without the need to subject the target to one of the above-described cold working procedures. As a result, it should be possible to achieve higher target yields and to use targets of greater thickness even for the class of cobalt base alloys containing intermetallic phases.

This task is accomplished by a target material having at least one of the two following characteristics:

(a) a matrix of primary cobalt mixed crystals is present, the grain boundaries, sub-grain boundaries, twin grain boundaries, or slip bands of which are decorated with the elements forming the intermetallic phases. More-or-less pronounced eutectic zones, consisting of the cobalt mixed crystals and intermetallic phases, are embedded in the matrix; or (b) the x-ray diffraction diagram shows x-ray reflections of an intermetallic phase which is not observed in the casting and which is formed by a solid-state reaction below the solidus temperature of the alloy in question.

This special structure is obtained by annealing the target material, after casting and possibly hot rolling it, at temperatures of no more than 300° C. below the temperature of the solid—solid transformation reaction. This temperature is to be determined separately for each alloy by means of a few small-scale tests. In the normal case, it is in the range of 700°-1,100° C. for the cobalt base alloys under consideration. Annealings too far below the transformation temperature lead to very slow transformation reactions because of the very slow diffusion rate and accordingly to long and uneconomical annealing times.

The cobalt base alloy contains not only elements such as Ni, Pt, Pd, and Cr but also elements such as Ta, B, Mo, W, Hf, V, and Nb, which form intermetallic phases with at least one of the previously mentioned elements. The content of intermetallic phase-forming elements must be large enough that they are no longer completely dissolved in the cobalt mixed crystal in the equilibrium state at the operating temperature of the target.

Another surprising discovery was made that targets which contain not only the Co mixed crystals but also intermetallic phases and which have been annealed at a suitable temperature, selected in accordance with the phase diagram, show a much higher magnetic field penetration than targets of the same composition produced directly from the cast slab or from a plate rolled at a temperature just under the solidus temperature.

In contrast, the annealing of targets which, because of their composition, contain no intermetallic phases, does not lead to any improvement in the magnetic field penetration. When such targets are subjected to the cold working procedures described in the literature, however, the expected improvement in the magnetic field penetration does in fact appear. A subsequent annealing at temperatures in the range of 700°–1,100° C., corresponding to the present invention, leads in this case to a partial or complete loss of this improvement in the magnetic field penetration. This makes it all the more surprising that cobalt base alloys which differ from these other alloys only in that they contain slightly higher percentage of the elements Ta, B, Mo, W, Hf, V, and Nb, so that intermetallic precipitation phases can now form, show such an improvement in the magnetic field penetration.

DETAILED DESCRIPTION OF THE PREFERRED EMBODIMENT

Figure 1:
FIG. 1 is a microprobe image of the structure of a target in accordance with the present invention. Gray matrix: cobalt mixed crystal; bright spots: intermetallic phases of the coarsened eutectic; fine, bright lines: decoration of the grain boundaries, sub-grain boundaries, twin grain boundaries, or slip bands. Magnification: 1,000:1.

Careful structural and phase studies of cobalt base alloys treated according to the present invention have shown that, as a result of the annealing, precipitations form which decorate the grain boundaries, twin grain boundaries, or slip bands of the cobalt mixed crystals. These precipitations contain significant amounts of the elements which also form the intermetallic phases (see FIG. 1). Furthermore, phase studies by means of x-ray diffractometry and electron microprobe analysis have shown that, as a result of the annealing, the composition of the intermetallic phases changes or new intermetallic phases are formed. This suggests the occurrence of a solid—solid transformation, such as that which is said to occur in the Co-Ta system (Massalski, T. M., editor: Binary Alloy Phase Diagrams, 2nd edition, ASM International, 1990).

Targets which have a structure in accordance with the present invention show a much higher magnetic field penetration than untreated targets of the same composition and geometry. They are in some cases superior even to targets which, because of the absence of intermetallic phases, must be produced by means of the cold working procedures described in the literature.

Table 1 summarizes the experimental results which were obtained on the basis of examples corresponding to the present invention and on the basis of comparison examples. All targets were produced by melting the corresponding alloying components under vacuum or inert gas and then by casting the melt into a mold.

To characterize the magnetic properties of the target, the magnetic field component parallel to the target surface was measured while the target was resting on a set of magnets for a PK150 cathode ($\phi$ 150mm). The field strength Hx was recorded at a distance of about 1 mm above the target. Without a target, that is, measured directly on the backing plate, the maximum value Hx,max was 95 kA/m.

TABLE 1

PRODUCTION PARAMETERS, MAGNETIC PROPERTIES, AND STRUCTURAL CHARACTERIZATION OF TARGETS. TARGET GEOMETRY FOR DETERMINATION OF Hx,max: $\phi$ 150 × 6 mm.

Figure 2:
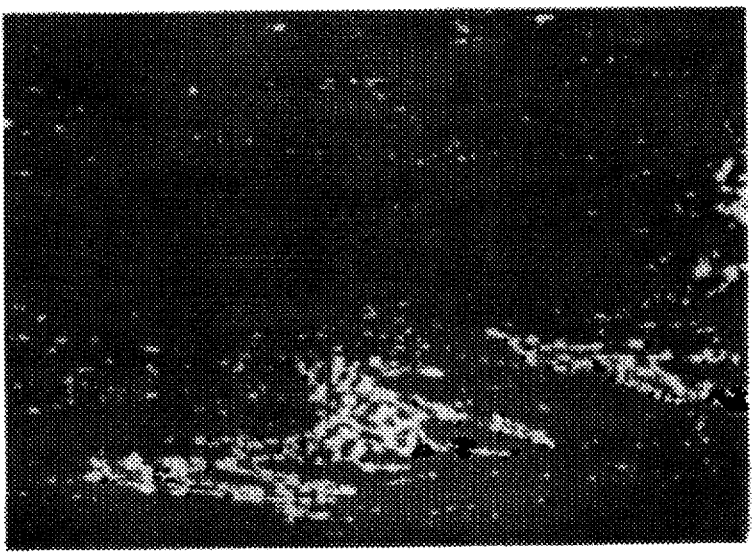
FIG. 2 is a microprobe image of the structure of a comparison target. Gray matrix: cobalt mixed crystal; bright spots: intermetallic phases of the coarsened eutectic. Magnification: 1,000:1.
Figure 3:
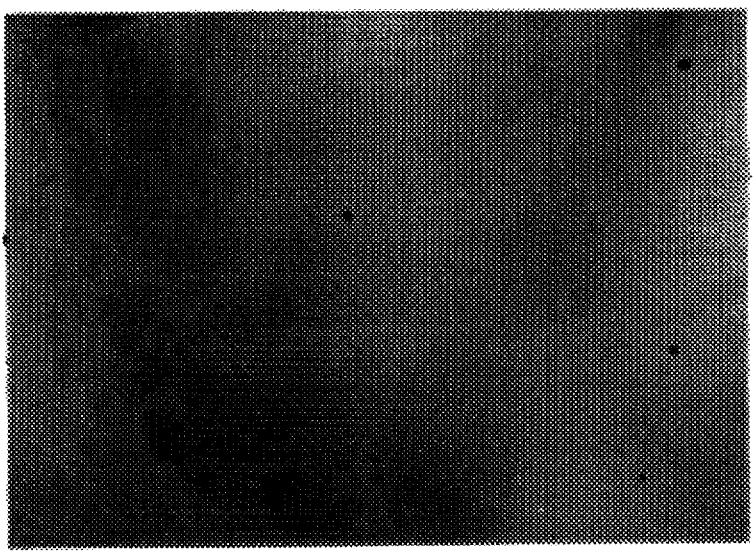
FIG. 3 is a microprobe image of the structure of a comparison target without intermetallic phases. Magnification: 1,000:1.

| | Composition (at %) | Rolling Temp. (°C.) | Annealing Temp (°C.) | Annealing Time (h) | $H_x$ max (kA/m) | Structure |
|---|---|---|---|---|---|---|
| A | CoCr(10,5)Ta(4) | 1150 | 850 | 86 | 50 | FIG.1 |
| A | CoCr(10,5)Ta(4) | — | 880 | 8 | 44 | FIG.1 |
| A | CoCr(10,5,)Ta(4) | 1150 | 750 | 360 | 39 | FIG.1 |
| B | CoCr(10,5)Ta(4) | 1) 1200 2) 700 | — | — | 29 | FIG.2 cracks |
| A | CoCr(10)Ta(6) | 1200 | 875 | 22 | 48 | FIG.1 |
| B | CoCr(10)Ta(6) | 1) 1250 2) 700 | — | — | 36 | FIG.2 large cracks |
| C | CoCr(12)Ta(2) | 1) 1150 2) 350 | — | — | 44 | FIG.3 |
| C | CoCr(12)Ta(2) | 1100 | 900 | 16 | 27 | FIG.3 |
| A | CoCr(9)Pt(9)Ta(2) | 1150 | 840 | 8 | 46 | FIG.1 |
| B | CoCr(9)Pt(9)Ta(2) | 1) 100 2) 750 | — | — | 25 | FIG.2 large cracks |
| C | CoCr(11)Pt(10)Ta(1) | 1150 | 820 | 12 | 28 | FIG.3 |
| A | CoCr(10)Ta(5) | 1100 | 800 | 20 | 41 | FIG.1 |
| D | CoCr(10)Ta(5) | 1200 | 1000 | 8 | 26 | FIG.2 |
| C | CoNi(18)Cr(8) | 1) 1100 2) 300 | — | — | 42 | FIG.3 |

TABLE 1-continued

PRODUCTION PARAMETERS, MAGNETIC PROPERTIES, AND STRUCTURAL CHARACTERIZATION OF TARGETS. TARGET GEOMETRY FOR DETERMINATION OF Hx,max: φ 150 × 6 mm.

| Composition (at %) | Rolling Temp. (°C.) | Annealing Temp (°C.) | Annealing Time (h) | $H_x$ max (kA/m) | Structure |
|---|---|---|---|---|---|

A: Targets according to the present invention.
B, C, D: Comparison examples.

DISCUSSION OF THE EXAMPLES

Case A

Before the annealing, a matrix of primary Co mixed crystals is present, into which eutectic regions of Co mixed crystals and intermetallic phases can be incorporated. After the annealing, the grain boundaries, sub-grain boundaries, twin grain boundaries, or slip bands are decorated with the elements which also form the intermetallic phases. Annealing is carried out below the solid—solid transformation temperature. x-ray reflections of a new intermetallic phase are seen. To the extent that intermetallic phases were observed before the annealing, their stoichiometry and lattice structure are altered.

Case B

The initial state is the same as that of Case A. Instead of the annealing treatment, a cold working procedure is now carried out. There is no decoration of the grain boundarie's, sub-grain boundaries, twin grain boundaries, or slip bands. The material is nevertheless so brittle that cold working leads to the formation of macroscopic cracks, which make the material unusable or which at least make it extremely difficult to process the material economically.

Case C

No intermetallic phases are present here, either because no element is present which can form an intermetallic phase with other components, or because the concentrations of the elements capable of forming intermetallic phases are so small that the solubility limit has not been exceeded in any case. In this situation, the cold working recommended in the literature is quite successful, whereas an annealing according to the present invention brings about no improvement in comparison with the untreated material. Neither the rolling nor the annealing leads to the formation of intermetallic phases.

Case D

The initial state is the same as that of Case A. Because the annealings are carried out above the solid-solid transformation temperature, there is no significant change in the microstructure or in the structure of the intermetallic phases. Under certain conditions, a certain portion of the intermetallic phases passes into solution.

We claim:

1. A cobalt base alloy target $Co_{1-x-y}M_xTa_y$ for magnetron cathode sputtering systems, where M stands for at least one of the elements Cr, Pt, Ni, and Pd, where $0 \leq x \leq 0.45$; where $0.015 \leq y \leq 0.20$; consisting of a structure of primarily hexagonal cobalt mixed crystals and intermetallic phases formed by Co, Ta, and optionally at least one element of M, where the target metal has at least one of the two following characteristics:

(a) the cobalt mixed crystal has at least one of grain boundaries, sub-grain boundaries, twin grain boundaries, and slip bands which are decorated with said intermetallic phases;

(b) x-ray diffraction diagrams produced from the target show reflections of said intermetallic phase which is mainly absent in the cast state of the metal and which does not form until a solid-state reaction occurs as a result of an annealing carried out in the temperature range below the solidus temperature of the alloy.

2. Target according to claim 1, characterized in that the composition is $Co_{1-x-y}Cr_xTa_y$, where $0 \leq x \leq 0.3$; $0.025 \leq y \leq 0.15$.

3. Target according to claim 1, characterized in that the composition is $Co_{1-x-y}Cr_wTa_yPt_z$, where $0 \leq w \leq 0.25$; $0.015 \leq y \leq 0.15$; $0 \leq z \leq 0.2$ and wherein w+z=x.

4. A cobalt base alloy target for a magnetron cathode, said alloy consisting of $Co_{1-x-y}M_xTa_y$, where M stands for at least one of Cr, Pt, Ni, and Pd, where $0 \leq x < 0.45$; where, $0.015 \leq y \leq 0.20$; said alloy consisting of a primarily hexagonal cobalt mixed crystal having at least one of grain boundaries, sub-grain boundaries, twin grain boundaries, and slip bands decorated with intermetallic phases formed by Co, Ta, and optionally at least one element of M.

5. Target according to claim 4, wherein the alloy is $Co_{1-x-y}Cr_xTa_y$, where $0 \leq x 0.3$ and $0.025 \leq y \leq 0.15$.

6. Target according to claim 4, wherein the alloy is $Co_{1-x-y}Cr_wTa_yPt_z$, where $0 \leq w \leq 0.25$, $0.015 \leq y \leq 0.15$, $0 \leq z \leq 0.2$ and wherein w+z=x.

* * * * *

UNITED STATES PATENT AND TRADEMARK OFFICE
CERTIFICATE OF CORRECTION

PATENT NO : 5,728,279
DATED : March 17, 1998
INVENTOR(S): Schlott et al.

It is certified that error appears in the above-identified patent and that said Letters Patent is hereby corrected as shown below:

On the title page, Item [56], OTHER PUBLICATIONS, line 1, change "Binory" to --Binary--.

In column 5, line 32, change "boundarie's" to --boundaries--.

In Claim 4, column 6, line 44, change "x < 0.45" to --x ≤ 0.45--.

In Claim 5, column 6, line 51, between "x" and "0.3" insert --≤--.

Signed and Sealed this

Twenty-ninth Day of June, 1999

Attest:

Q. TODD DICKINSON

Attesting Officer    Acting Commissioner of Patents and Trademarks